(12) United States Patent
van Dalen

(10) Patent No.: US 8,410,417 B2
(45) Date of Patent: Apr. 2, 2013

(54) PHOTOSENSITIVE SYSTEM INCLUDING AN OUTPUT BUFFER COUPLED TO A GATED PHOTODIODE FOR REDUCING AN IMPEDANCE OF THE PHOTODIODE SIGNAL

(75) Inventor: Rob van Dalen, Bergeijk (NL)

(73) Assignee: NXP B.V., Eindhoven (NL)

(*) Notice: Subject to any disclaimer, the term of this patent is extended or adjusted under 35 U.S.C. 154(b) by 328 days.

(21) Appl. No.: 12/954,404

(22) Filed: Nov. 24, 2010

(65) Prior Publication Data

US 2011/0290988 A1    Dec. 1, 2011

(30) Foreign Application Priority Data

Nov. 25, 2009 (EP) .................................. 09177020

(51) Int. Cl.
   *H01J 40/14* (2006.01)
(52) U.S. Cl. ................... 250/214 R; 250/214.1
(58) Field of Classification Search .............. 250/214 R, 250/214.1, 208.1; 257/328, 355–363; 327/432, 327/543, 514
   See application file for complete search history.

(56) References Cited

U.S. PATENT DOCUMENTS

| | | | |
|---|---|---|---|
| 5,898,753 | A | 4/1999 | Schick |
| 6,166,768 | A | 12/2000 | Fossum et al. |
| 6,177,293 | B1 | 1/2001 | Netzer et al. |
| 6,414,358 | B1 * | 7/2002 | Lin et al. ............ 257/356 |
| 6,635,857 | B1 | 10/2003 | Kindt |
| 6,809,767 | B1 | 10/2004 | Kozlowski et al. |
| 2006/0033128 | A1 | 2/2006 | Chi |

FOREIGN PATENT DOCUMENTS

| | | |
|---|---|---|
| EP | 1 760 793 A2 | 3/2007 |
| EP | 1 798 575 A2 | 6/2007 |
| WO | 2004/042823 A1 | 5/2004 |

OTHER PUBLICATIONS

Scobey, R. et al. "A Simple Circuit to Reduce the Input Capacitance of Microelectrode Amplifiers," IEEE Trans. on Biomedical Engineering, vol. BME-28, No. 4, pp. 358-359 (Apr. 1981).
Brigati. S. et al. "Active Compensation of Parasitic Capacitances for Very High Frequency CMOS DACs", IEEE Int'l. Symp. on Circuits and Systems, pp. 1208-1211 (1993).
O'Connor, P. et al. "CMOS Preamplifier with High Linearity and Ultra Low Noise for X-Ray Spectroscopy," IEEE Trans. on Nuclear Science, vol. 44, No. 3, pp. 318-325 (Jun. 1997).
Luk, W. et al. "Gated-Diode Amplifiers," IEEE Trans. on Circuits and Systems—II: Express Briefs, vol. 52, No. 5, pp. 266-270 (May 2005).
Eltoukhy, H. et al. "A 0.18-μm CMOS Bioluminescence Detection Lab-on-Chip," IEEE J. of Solid-State Circuits, vol. 41, No. 3, pp. 651-662 (Mar. 2006).
Zelakiewicz, S. et al. "Gated Diode Design to Mitigate Radiation Damage in X-Ray Imagers," IEEE Electron Device Letters, vol. 29, No. 1, pp. 70-72, (Jan. 2008).
Extended European Search Report for European Patent Appln. No. 09177020.6 (May 7, 2010).

* cited by examiner

Primary Examiner — Que T Le

(57) ABSTRACT

Disclosed is a photosensitive system including a gated photodiode having at least one field plate and a cathode and an output buffer having an input coupled to the gated photodiode for reducing the impedance of the photodiode signal and having an output for providing the reduced impedance signal. The output is electrically connected to the at least one field plate. A device including such a photosensitive system is also disclosed.

11 Claims, 3 Drawing Sheets

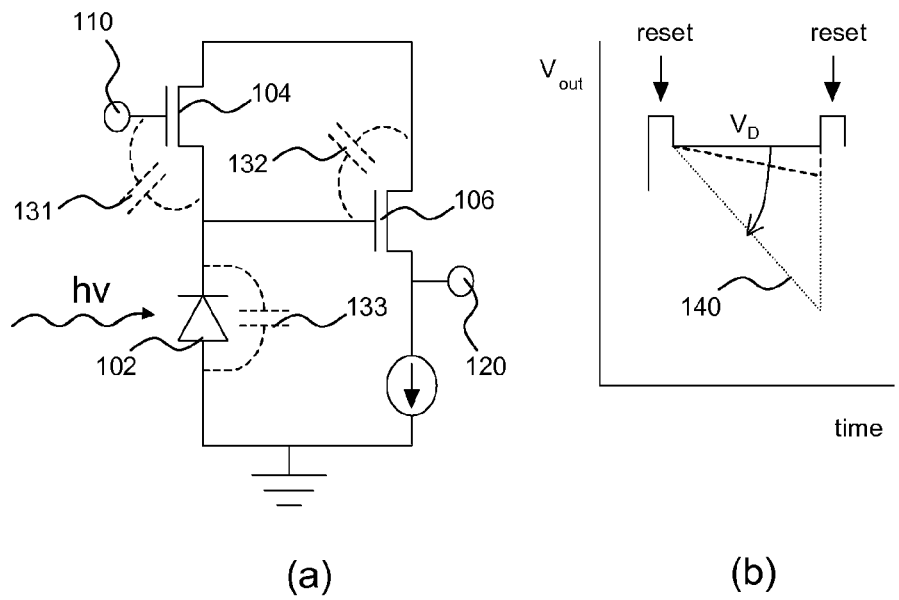
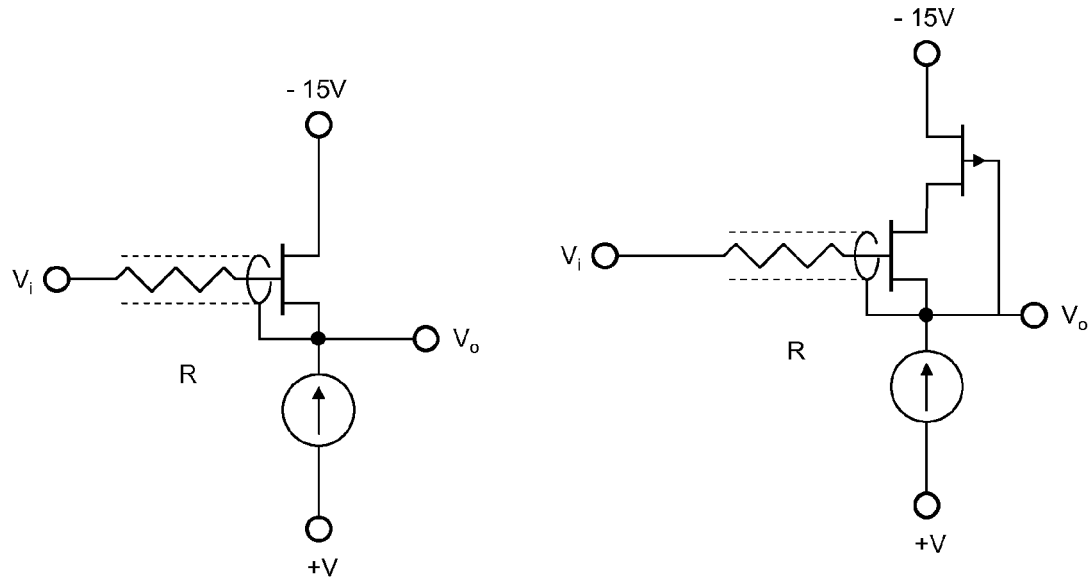
FIG. 1
FIG. 2

PHOTOSENSITIVE SYSTEM INCLUDING AN OUTPUT BUFFER COUPLED TO A GATED PHOTODIODE FOR REDUCING AN IMPEDANCE OF THE PHOTODIODE SIGNAL

This application claims the priority under 35 U.S.C. §119 of European patent application no. 09177020.6, filed on Nov. 25, 2009, the contents of which are incorporated by reference herein.

FIELD OF THE INVENTION

The present invention relates to a photosensitive system and a device comprising such a system.

BACKGROUND OF THE INVENTION

CMOS imagers are interesting candidates to replace traditional imaging sensors used in e.g. medical applications, because of their ability to integrate on-chip the read-out circuitry, data processing facilities and interfacing. Such integration, particularly by removing the need for external bond-wired chip-to-chip connections, offers significant performance advantages as well as cost-savings.

Basic building blocks of a typical high sensitivity photosensitive system are formed by a combination of a photodiode and a buffer stage, of which the latter transforms the high-impedance photodiode output to a lower impedance in order to allow subsequent processing of the detected signal. A key performance parameter for such a system is the total input capacitance of the photodiode and buffer, which directly determines the sensitivity in terms of the change in voltage per detected photon.

FIG. 1a shows a typical (so-called 3T) prior art pixel architecture, including relevant parasitic capacitances 131-133. The pixel architecture comprises a photodiode 102 coupled to a reset transistor 104, which is coupled to output node 120 via a source following transistor 106. The reset transistor 104 has in input terminal 110 for receiving a reset pulse. Operation of such a pixel is straightforward and involves two different phases (FIG. 1b). During a first (reset-) phase, the photodiode node is set to $V_D$ by applying a positive pulse on the reset transistor 102. After switching off this transistor, the photodiode node is essentially left floating as it is not electrically connected to any terminal. Incoming photons, indicated by the wavy arrow with label hv, result in a discharging of the diode resulting in, depending on the intensity of the incoming light, a gradual decrease in bias on an output node, as indicated by transient 140. The sensitivity of such a system is determined by the total capacitance $C_{tot}$ seen by the photodiode node, $$C_{tot} = C_{pd} + C_{gd}^{SF} + C_{gs}^{reset}$$

$$\Delta V = \frac{qn_{ph}}{C_{tot}}$$

where $\Delta V$ is the voltage drop induced by $n_{ph}$ collected photons.

It is noted that the sensitivity is independent on the gate-source capacitance $C_{gs}^{SF}$ of the source follower (SF) 106, as the SF's source voltage exactly follows that of the photodiode 102 ($\Delta V = V_{pd} - V_{out} \approx V_t$ = constant). This observation that two nodes with identically varying bias are not capacitively coupled has been extensively used when designing low-input capacitance buffers. Using discrete components, one can simply bootstrap the supply bias and ground node to the output by means of operational amplifiers, resulting in an effective input capacitance reduction of the buffer.

A much simpler, yet as effective, implementation for integrated circuits is shown in FIG. 2, which depicts a simple input buffer capacitance reduction. Two bandpass circuits are shown. The left circuit illustrates a FET in a source follower configuration. R is a resistor for testing the performance of the source follower (SF). When R=0, the source follower has a nearly unity gain for a range of frequencies from 10 Hz to 10 kHz. With R=1000 MΩ the gain decreases with increasing frequency. The right circuit illustrates a cascaded source follower configuration (CSF). Under similar operating conditions, the bandpass with R=1000 MΩ is increased by an order of magnitude. This is described in more detail in R. P. Scobey et al., "A simple circuit to reduce the input capacitance of microelectrode amplifiers", IEEE trans. Biomed. Eng. 28, pp. 358-359, 1981.

The above solutions effectively compensate for stray capacitances of an input buffer, with a possibility to also include compensation for the stray capacitance of an input wire. In such solutions, the only significant capacitances left are those of components attached to the input node of the buffer, e.g. the photodiode and reset transistor. The latter can be compensated for by means of active compensation. Thereto, as shown in FIG. 3, an extra capacitor $C_2$ is added to the input node, which is then driven at a given amount of feedback bias. This feedback loop is not explicitly shown in FIG. 3, but is disclosed in more detail in S. Brigati et al., "Active compensation of parasitic capacitances for very high frequency CMOS DACs", IEEE International Symposium on Circuits and Systems (ISCAS), pp. 1208-1211, 1993

Some medical applications typically require an extremely high sensitivity, to be able to measure for example very low levels of fluorescence induced by biomarkers. As a consequence, such systems require relatively large pixels to collect as many photons as possible with, as discussed above, the lowest possible pixel capacitance. It will be apparent to the skilled person that these requirements counteract each other, even when using diffusion-based designs with reduced cathode area. This is a major drawback of these prior art arrangements.

Apart from just high sensitivity and large area, the above and prior art detectors also need extremely low leakage currents, in order to be able to actually detect a low number of emitted photons. Again, requirements for low leakage as well as low capacitance counteract each other here. As surface leakage effects are typical a dominant mechanism at room temperature, as compensation, low leakage cathodes require some amount of field shaping around its perimeter. Gated diodes have been used as an effective means to suppress such leakage currents, with added benefit of improving radiation hardness. An example of such a solution can for instance be found in EP 1798575 A1.

Low leakage may be achieved by bringing the surface into slight accumulation, which for an n+ cathode photo-detector corresponds to biasing the outer gate of the diode around or slightly below 0V. As the depletion region width between the n+ cathode and the p+ anode can easily be of the order of several microns compared to the gate oxide thickness of several nanometers only, it follows directly from the capacitance equation $C = A \epsilon_0 \epsilon_r / t$, t being the oxide thickness, that such gates quite easily dominate the total capacitance.

Hence, state of the art photodiodes typically feature a capacitance that is relative large, which limits the sensitivity of imaging systems in which they are integrated. As explained above, such capacitance can be reduced by active compensation, although process variations will typically limit such an approach to an improvement of around one order of magnitude only. In addition, active compensation adds to the complexity, i.e. cost, of the overall photodiode implementation. Hence, it would be advantageous to reduce the actual photodiode capacitance, thereby limiting or altogether avoiding the amount of capacitance that needs to be compensated for.

The present invention is aimed at providing an improved photosensitive system overcoming one or more of the above disadvantages, and at the same time not jeopardizing other characteristics of an improved photosensitive system.

SUMMARY OF THE INVENTION

In the present application, inventors propose to extend existing methodologies to create low input capacitance buffers, such that the capacitance of the photodiode is simultaneously minimized. This allows manufacturing of extremely high sensitivity photosensitive systems that open up new opportunities in various fields, such as biomedical analysis.

In accordance with an aspect of the present invention, there is provided a photosensitive system comprising a gated photodiode comprising at least one field plate and a cathode; and an output buffer having an input coupled to the gated photodiode for reducing the impedance of the photodiode signal and having an output for providing the reduced impedance signal, wherein said output is electrically connected to the at least one field plate.

In the present application a photosensitive system is disclosed that combines a low-input capacitance output buffer with gated-diode photodiodes, and connects the buffer's feedback to the photodiode's field plates. Such a design allows the design of photosensitive systems with extremely high sensitivity and extremely low leakage, enabling the manufacturing of (among others) biomedical imagers for fluorescent marker detection.

The proposed combination a low-input capacitance output buffer, e.g. an amplifier, with a gated-diode photodiode, in which the buffer output is fed back to the photodiode's field plates, which facilitates the design of photosensitive systems with extremely high sensitivity and extremely low leakage.

For example, based on a conservative estimate involving an advanced CMOS process, such as a 180 nm process, it has been found that the required capacitance of the field plates to achieve the required low leakage of a system according to the present invention, i.e. the perimeter capacitance, is of the order of 10 fF for a 2 $\mu m^2$ active perimeter area and 7 nm gate oxide. The latter is approximately an order of magnitude above the bulk capacitance of a similar diode, which typically has a 5 $\mu m^2$ area and a 0.5 $\mu m$ depletion width. Theoretically, assuming that all other capacitances, e.g. the input buffer and reset transistor, are ideally compensated, this suggests that the present system allows an improvement in sensitivity of around an order of magnitude without requiring active capacitance compensation.

At this point it is important to note that a total input impedance of 1-10 fF compares favorably to typical prior art systems in which this impedance is typically around 150 fF. The much lower total input impedance of the photosensitive system of the present invention corresponds to a sensitivity of 16-160 $\mu V$/photon, which is high enough to facilitate (sub) single photon detection, contrary to the less sensitive prior art systems where single proton detection is more difficult to achieve. Hence, the photosensitive system of the present invention allows what essentially are conventional CMOS photodiodes to compete with much more complex avalanche photodiodes in terms of sensitivity.

Hence, in the present invention, a conventional gated diode structure essentially remains identical, with only its gate (field plate) connection being changed. Whereas the gate connection is normally connected to an electrical ground, the present invention provides to route the gate to the (low capacitance) input buffer and connect it in such a manner that its bias follows that of the photodiode's cathode. This effectively removes the conventional gated diodes' perimeter capacitance. The resulting photodiode has a very low intrinsic capacitance as the dominant contribution the perimeter field plate to the overall capacitance is effectively removed.

The typical bias of the gate should preferably be such that the underlying silicon region with the lowest doping concentration (typically the p- region) is in weak accumulation to minimize leakage.

Although the present high sensitivity pixels can be used in all applications that require extremely high sensitivity and low leakage in combination with relatively large pixel size, especially biomedical applications involving detection of very weak emissions from biomedical markers (fluorescent of chemo-luminescence) are envisaged. The present invention for instance finds application within a hemostase biochip, which ultimately targets the development of small form factor, cheap and reliable lab-on-a-cards for (among others) measurement of blood clotting parameters.

The present invention is further elucidated by the following figures and examples, which are not intended to limit the scope of the invention. The person skilled in the art will understand that various embodiments may be combined.

BRIEF DESCRIPTION OF THE DRAWINGS

FIG. 1a) shows a typical 3T photodiode architecture, comprising of a photodiode, reset transistor and source follower;

FIG. 1b) shows a schematic output signal for different intensities of the architecture of FIG. 1a);

FIG. 2 shows a simple input buffer capacitance reduction;

DETAILED DESCRIPTION OF EMBODIMENTS

Figure 3:
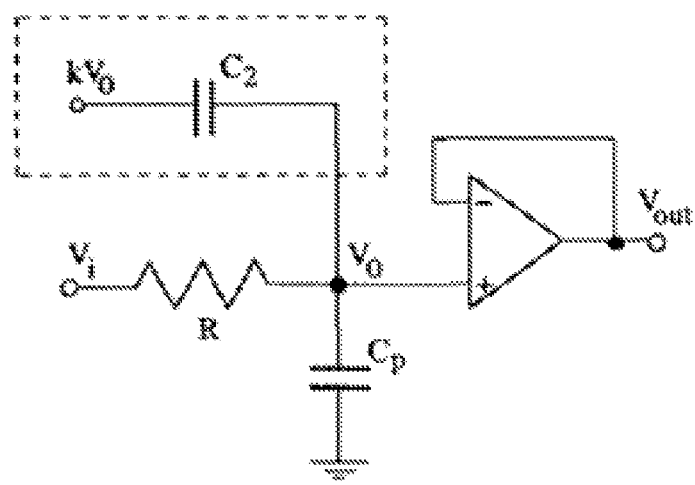
FIG. 3 shows active input capacitance compensation.
Figure 4A:
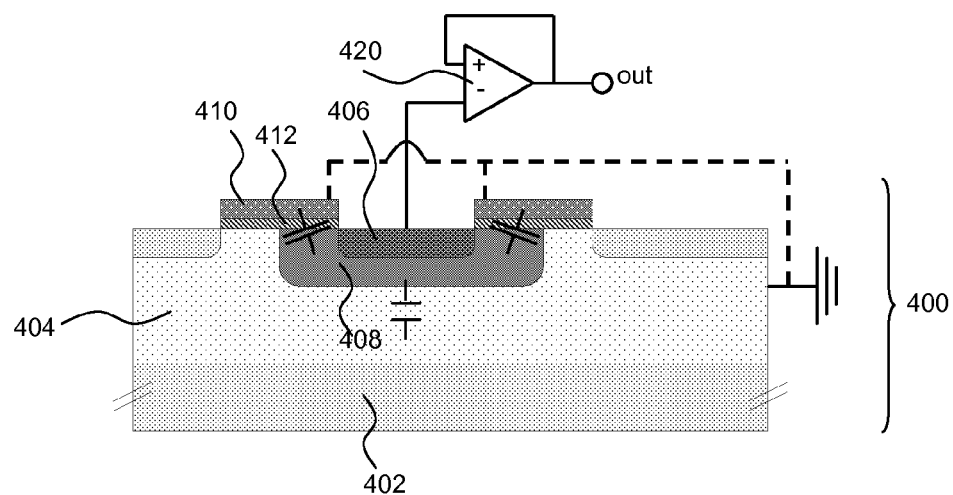
FIG. 4a) shows a conventional gated diode structure.

FIG. 4a) shows a conventional photosensitive system including a gated photodiode 400. The diode 400 is formed on a $p^+$-type substrate 402 in which a $p^-$type epitaxial layer 404 is formed, which embeds an n-well 408 including a highly doped $n^+$ region 406 acting as a cathode. The photodiode 400 comprises a field plate 410 that covers the perimeter of the photodiode 400 and that is separated from the impurity regions in the substrate including the p-n junction between the n-well 408 and the epitaxial layer 404 by a gate dielectric 412, e.g. a suitable gate oxide. The field plate 410 is connected to a fixed potential source, i.e. ground in FIG. 4a.

The highly doped $n^+$ cathode region 406 is conductively connected to a buffer 420, which may be implemented in any suitable manner, e.g. as a differential amplifier having one of its inputs connected to the cathode of the photodiode 400 and the other of its inputs connected to its output, i.e. connected to a feedback loop. As indicated in FIG. 4a), this arrangement has the consequence of the presence of several parasitic capacitances, such as the parasitic capacitance formed by the field plate 410 and the n-well 408 as the opposite plate separated from each other by the gate dielectric 412, and the parasitic capacitance between the n-well 408 and the p-type epitaxial layer 404. As previously explained, the overall parasitic capacitance, i.e. the sum of all individual capacitances, is dominated by the parasitic capacitance formed by the field plate 410 and the n-well 408 as the opposite plate separated from each other by the gate dielectric 412. Hence, the neutralization of this dominant parasitic capacitance would significantly improve the sensitivity of the photosensitive system shown in FIG. 4*a*.

Figure 4B:
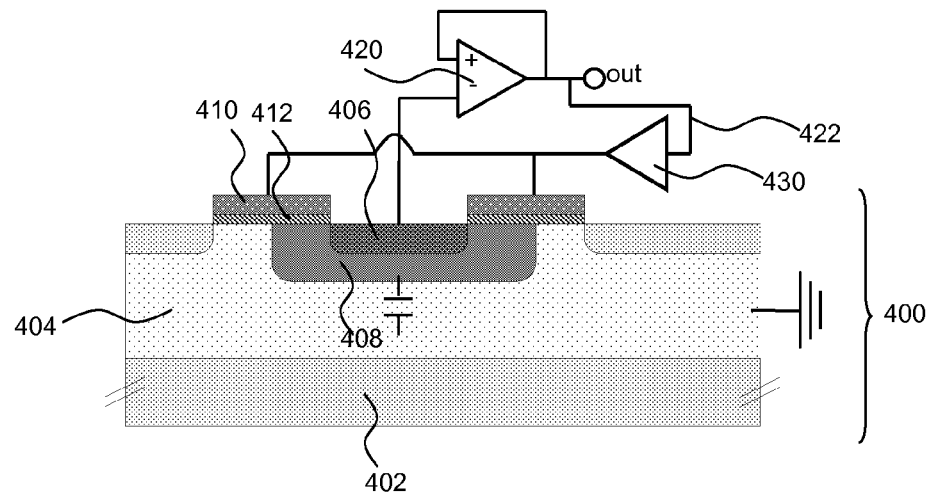
FIG. 4b) shows a gated diode operation according to an exemplary embodiment of the present invention.

FIG. 4*b*) shows an exemplary embodiment of a photosensitive system of the present invention. The system is essentially the same as the system shown in FIG. 4*a*) apart from the fact that the field plate 410 is biased by a conductive connection 422 to the output of the buffer 420. This conductive connection 422 effectively provides a loopback from the output of the buffer to its input via the field plate 410, which has the effect that the bias difference between the cathode 406 and the gate of the photodiode 400 remains constant, such that the dominant contribution of the aforementioned dominant capacitance is effectively removed. More precisely, in such an arrangement, the field plate bias will follow the bias of the cathode 406 of the photodiode 400.

As is well known, the bias of the gate 408 should preferably be chosen such that the underlying silicon region having the lowest impurity concentration, e.g. the p⁻ epitaxial region 404, is in weak accumulation, such that the leakage current from the diode 400 is minimized. Consequently, a photosensitive system, e.g. a pixel, can be achieved that has a large area yet has a low leakage current combined with a much improved sensitivity. It is important to realize that the photosensitive system shown in FIG. 4*b*) can be realized using conventional processing technologies, in particular CMOS technologies. This means that the photosensitive system can be realized in an affordable manner, whilst being able to compete in terms of sensitivity with the much more complex avalanche photodiode-based systems.

It is furthermore pointed out that FIG. 4*b*) shows a non-limiting example of such a system. Many adaptations of the system will be apparent to the skilled person. For instance, although the buffer 420 is shown as a differential amplifier, it will be clear to the skilled person that other types of buffers are equally feasible, such as the combination of a reset transistor and a source following transistor as shown in FIG. 1*a*). Also, the skilled person will realize that the conductive connection 422 between the output of the buffer 420 and the field plate 410 may be a direct connection, or alternatively may contain additional circuit elements such as a further buffer 430, which also may be any suitable type of buffer. The skilled person will furthermore realize that the photodiode 400 may be implemented in any suitable manner, and is not limited to the specific layout shown in this figure. Also, the use of impurity types opposite to those shown in FIG. 4*b* is equally feasible.

The photosensitive system shown in FIG. 4*b*) or equivalents thereof may be advantageously integrated in any device that benefits from the improved sensitivity of the photosensitive system of the present invention. In particular, such benefits are expected to occur in devices in which the electromagnetic radiation levels are very low, e.g. a few photons only. Although this may apply to a large number of application domains, one particular application domain that is targeted by the present invention is medical devices. There is for instance a large interest into disposable medical devices that can be used by the patient or medical staff for diagnostic purposes, in which e.g. an assay is provided that generates photonic emissions at levels correlated to a diagnostic parameter, such as blood clotting, i.e. hemostasis, parameters, by means of e.g. fluorescence or chemo-luminescence. The photosensitive system of the present invention is particularly suitable for integration into a small form-factor lab-on-a-card type device, such as a biochip for measuring hemostasis.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. Photosensitive system comprising:
a gated photodiode comprising:
at least one field plate and a cathode; and
an output buffer having an input coupled to the gated photodiode for reducing an impedance of a photodiode signal and having an output for providing the reduced impedance signal, wherein said output is electrically connected to the at least one field plate.

2. The photosensitive system of claim 1, wherein said output is connected to the field plate via a further buffer.

3. The photosensitive system of claim 1, wherein the output buffer is an amplifier.

4. The photosensitive system of claim 3, wherein the amplifier comprises a pair of inputs, the first of said pair of inputs being connected to the gated photodiode and the second of said pair of inputs being connected to the output.

5. The photosensitive system of claim 1, wherein the at least one field plate has a capacitance in the range from 0.1-100 fF.

6. The photosensitive system of claim 5, wherein said capacitance is in the range of 1-10 fF.

7. The photosensitive system of claim 1, wherein the output buffer comprises a reset transistor and a source follower.

8. The photosensitive system of any of claim 1, wherein the system is realized in CMOS technology.

9. Device comprising a photosensitive system according to claim 1.

10. The device of claim 9, wherein the device is a biomedical imager for at least one of fluorescent, chemo-luminescence, and phosphorescent marker detection.

11. The device of claim 10, wherein the device is a hemostasis measuring biochip.

* * * * *